(12) United States Patent
Weng et al.

(10) Patent No.: US 7,994,598 B2
(45) Date of Patent: Aug. 9, 2011

(54) ELECTRONIC ASSEMBLY FOR IMAGE SENSOR DEVICE

(75) Inventors: Jui-Ping Weng, Miaoli (TW); Tzu-Han Lin, Hsinchu (TW)

(73) Assignee: Visera Technologies Company Limited, Hsinchu (TW)

( * ) Notice: Subject to any disclaimer, the term of this patent is extended or adjusted under 35 U.S.C. 154(b) by 0 days.

(21) Appl. No.: 12/897,176

(22) Filed: Oct. 4, 2010

(65) Prior Publication Data
US 2011/0018082 A1    Jan. 27, 2011

Related U.S. Application Data

(62) Division of application No. 11/944,558, filed on Nov. 23, 2007, now Pat. No. 7,829,966.

(51) Int. Cl.
*H01L 31/0232* (2006.01)
(52) U.S. Cl. .................. 257/432; 257/E31.127
(58) Field of Classification Search .................. 257/432
See application file for complete search history.

(56) References Cited

U.S. PATENT DOCUMENTS

| | | |
|---|---|---|
| 5,274,456 A | 12/1993 | Izumi et al. |
| 2002/0139977 A1 | 10/2002 | Bae et al. |
| 2007/0045515 A1 | 3/2007 | Farnworth et al. |
| 2008/0164550 A1 | 7/2008 | Chen et al. |

*Primary Examiner* — Jarrett J Stark
*Assistant Examiner* — Lawrence Tynes, Jr.
(74) *Attorney, Agent, or Firm* — Muncy, Geissler, Olds & Lowe, PLLC (57) ABSTRACT

An electronic assembly for an image sensor device is disclosed. The electronic assembly comprises a package module and a lens set mounted thereon. The package module comprises a device substrate comprising at least one grounding plug therein, in which the grounding plug is insulated from the device substrate and an array of optoelectronic devices therein. A transparent substrate comprises a dam portion attached to the device substrate to form a cavity between the device and transparent substrates. A micro-lens array is disposed within the cavity. A conductive layer is electrically connected to the grounding plug and covers the sidewalls of the lens set and the package module and the upper surface of the lens set. A method for fabricating the electronic assembly is also disclosed.

8 Claims, 10 Drawing Sheets

ELECTRONIC ASSEMBLY FOR IMAGE SENSOR DEVICE

CROSS REFERENCE TO RELATED APPLICATIONS

This application is a Divisional of application Ser. No. 11/944,558, filed on 23 Nov. 2007 now U.S. Pat. No. 7,829,966, and for which priority is claimed under 35 U.S.C. §120; the entire contents of which is hereby incorporated by reference.

BACKGROUND OF THE INVENTION

1. Field of the Invention

The invention relates to image sensor technology and more particularly to a package module and an electronic assembly for an image sensor device with electromagnetic interference (EMI) shielding.

2. Description of the Related Art

Microelectronic imagers are used in digital cameras, wireless devices with picture capabilities, and many other applications. Cell phones and Personal Digital Assistants (PDAs), for example, incorporate microelectronic imagers for capturing and sending digital images. The use of microelectronic imagers in electronic devices has steadily increased as imagers have become smaller and are producing higher quality images with increased pixel counts.

A microelectronic imager typically includes an image sensor device, such as a charge coupled device (CCD) or a complementary metal oxide semiconductor (CMOS) image sensor device. CCD image sensors are widely used in digital cameras and other applications. CMOS image sensors are also becoming very popular due to lower production costs, higher yields, and smaller sizes, enabled by using manufacturing technology and equipment developed for fabricating semiconductor devices.

A typical image sensor device includes an array of pixel diodes, control circuitry, an analogue to digital converter, and an amplifier. Regardless of whether these devices are on the same chip as the sensor device, in the camera module or on the printed circuit board (PCB), protection against electromagnetic interference (EMI) resulting from electromagnetic radiation is a design challenge. If EMI protection can not be designed into a package module or electronic assembly of an image sensor device, performance may suffer.

BRIEF SUMMARY OF THE INVENTION

A detailed description is given in the following embodiments with reference to the accompanying drawings. Electronic assemblies for image sensor devices are provided. An embodiment of an electronic assembly for an image sensor device comprises a package module and a lens set mounted thereon. The package module comprises a device substrate comprising an array of optoelectronic devices and at least one grounding plug therein, in which the grounding plug is insulated from the device substrate and the array of optoelectronic devices. A transparent substrate comprises a dam portion attached to the device substrate to form a cavity between the device and transparent substrates. A micro-lens array is disposed on the device substrate and within the cavity. A conductive layer is electrically connected to the grounding plug and covers the sidewalls of the lens set and the package module and the upper surface of the lens set, having an opening allowing light to reach the array of optoelectronic devices.

Another embodiment of an electronic assembly for an image sensor device comprises a package module and a lens set mounted thereon. The package module comprises a device substrate having front and rear surfaces and comprising an array of optoelectronic devices therein and at least one grounding pad disposed on the rear surface of the device substrate and extending to the sidewall of the device substrate, in which the grounding pad is insulated from the device substrate and the array of optoelectronic devices. A transparent substrate comprises a dam portion attached to the front surface of the device substrate to form a cavity between the device and transparent substrates. A micro-lens array is disposed on the front surface of the device substrate and within the cavity. A conductive layer covers the sidewall and the upper surface of the lens set and extends to the sidewall of the device substrate to contact the grounding pad, having an opening allowing light to reach the array of optoelectronic devices.

Yet another embodiment of an electronic assembly for an image sensor device comprises a package module and a lens set mounted thereon. The package module comprises a device substrate comprising an array of optoelectronic devices therein. A transparent substrate comprises a dam portion attached to the device substrate to form a cavity between the device and transparent substrates. A micro-lens array is disposed on the device substrate and within the cavity. A permeability layer covers the sidewalls of the lens set and the package module and the upper surface of the lens set, having an opening allowing light to reach the array of optoelectronic devices.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

The invention relates to an electronic assembly for an image sensor device and a method for fabricating the same, capable of suppressing EMI. FIG. 1H illustrates an embodiment of an electronic assembly for an image sensor. The electronic assembly for the image sensor device, such as a miniature compact camera module (CCM), comprises an image sensor chip scale package (CSP) module, a lens set 126, and a conductive layer 134. The CSP module comprises a device substrate 100, a transparent substrate 160 opposite to the device substrate 100 and a micro-lens array 104 disposed therebetween. The device substrate 100, such as a silicon substrate or other semiconductor substrates may comprise a CCD or CMOS image sensor. The CCD or CMOS image sensor typically comprises an array of optoelectronic devices 102, such as pixel diodes, disposed in the device substrate 100. At least one grounding plug 114b is disposed in the device substrate 100 to be electrically connected to a corresponding conductive layer 101 formed in the device substrate 100. The conductive layer 101, such as a metal layer, and the grounding plug 114b are insulated from the device substrate 100 and the array of the optoelectronic devices 102. In particular, each grounding plug 114b is insulated from the device substrate 100 by a dielectric layer 112 surrounding the grounding plug 114b. A corresponding grounding pad 116b and a corresponding grounding ball 118b are successively disposed on the grounding plug 114b and opposite to the conductive layer 101. An array of plugs 114a is disposed in the device substrate to electrically connect to the array of the optoelectronic devices 102. Similar to the grounding plug 114b, each plug 114a is insulated from the device substrate 100 by a dielectric layer 112 surrounding the plug 114a. Moreover, an array of bonding pads 116a and a ball grid array (BGA) 118a are successively disposed on the array of plug 114b and opposite to the array of the optoelectronic devices 102.

The transparent substrate 160, such as a glass or quartz substrate, comprises a dam portion 160a attached to the device substrate 100. The dam portion 160a of the transparent substrate 160 is attached to the device substrate 100 by an adhesion layer 110 and forms a cavity 160b between the device substrate 100 and the transparent substrate 160. The micro-lens array 104 is disposed on the device substrate 100 and within the cavity 160b.

The lens set 126 comprising a stack of multiple lenses is mounted on the package module. The conductive layer 134, such as a metal layer, covers the sidewalls of the lens set 126 and the package module and extends to the upper surface of the lens set 126, having an opening 140 allowing light (not shown) to reach the array of optoelectronic devices 102. Moreover, the conductive layer 134 is electrically connected to the grounding plug 114b by directly contacting the conductive layer 101 for EMI protection. In the embodiment, an opaque layer 136 comprising, for example, of opaque paint, may cover the conductive layer 134 to serve as a light shielding layer. Alternatively, a transparent conductive layer 130, such as an indium tin oxide (ITO) or indium zinc oxide (IZO) conductive layer, may optionally be disposed on the upper surface of the lens set 126 and be covered by the conductive layer 134 to further enhance EMI protection; while also being capable of allowing light to reach the array of optoelectronic devices.

Figure 1A:
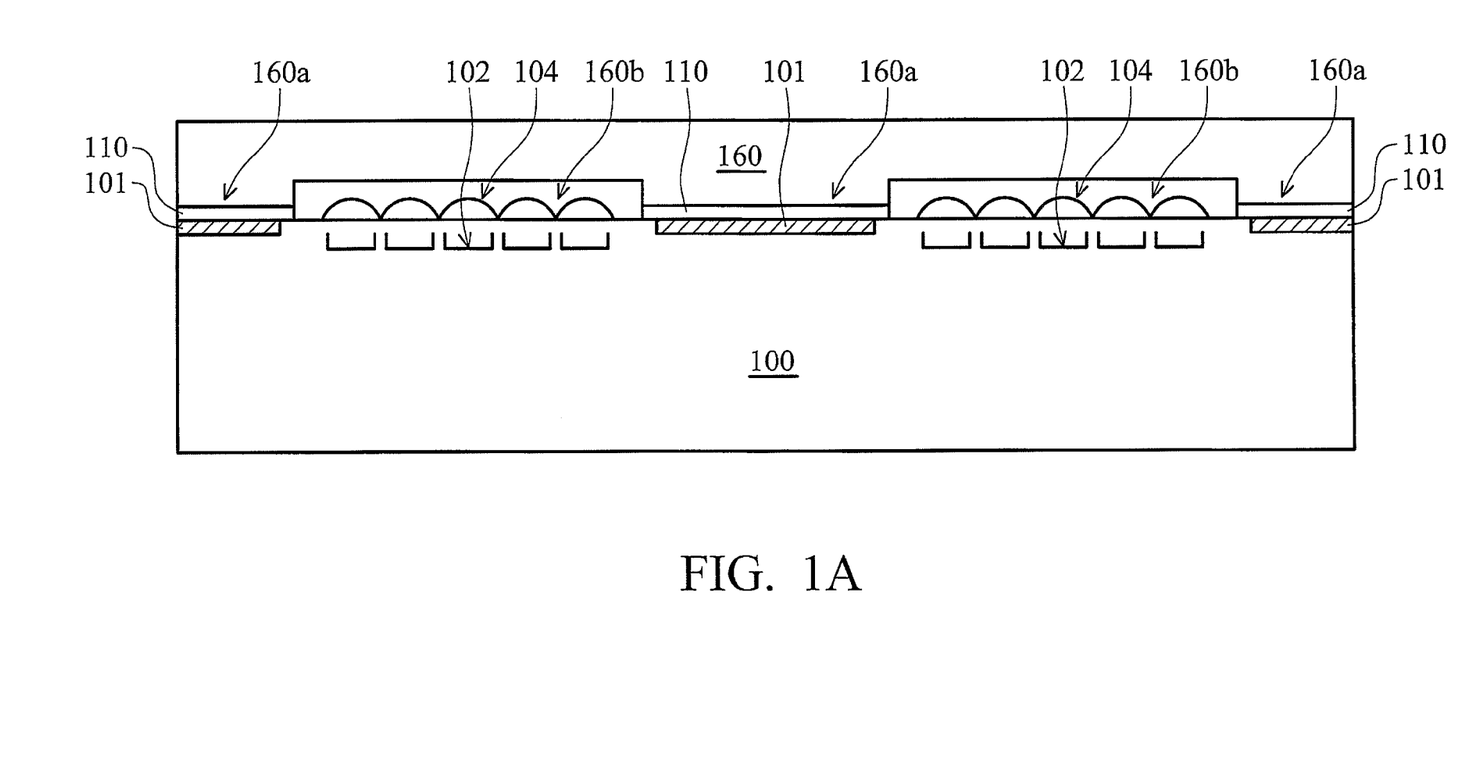
FIGS. 1A to 1H are cross sections of an exemplary embodiment of an electronic assembly for an image sensor device according to the invention.
Figure 1B:
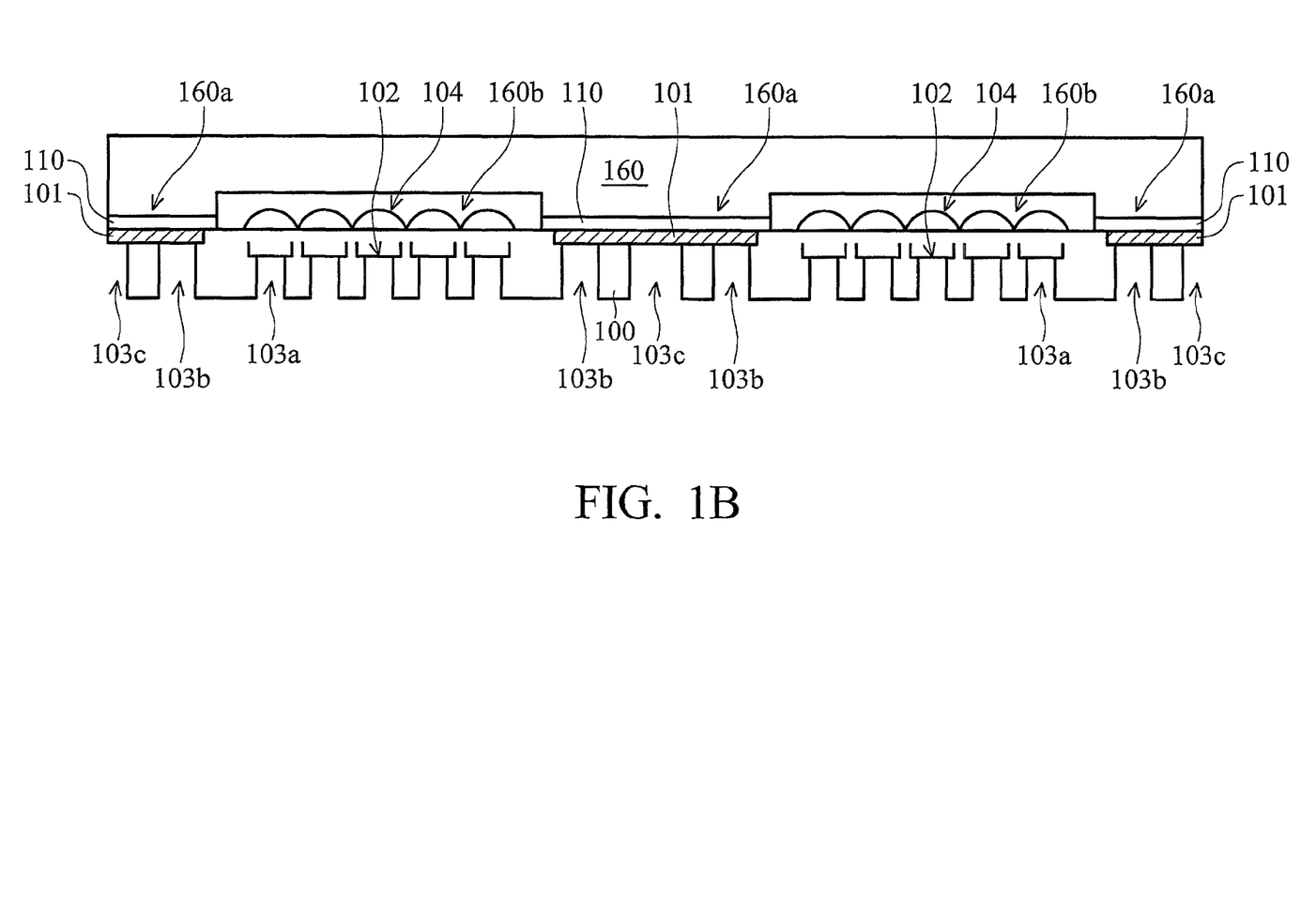
Figure 1C:
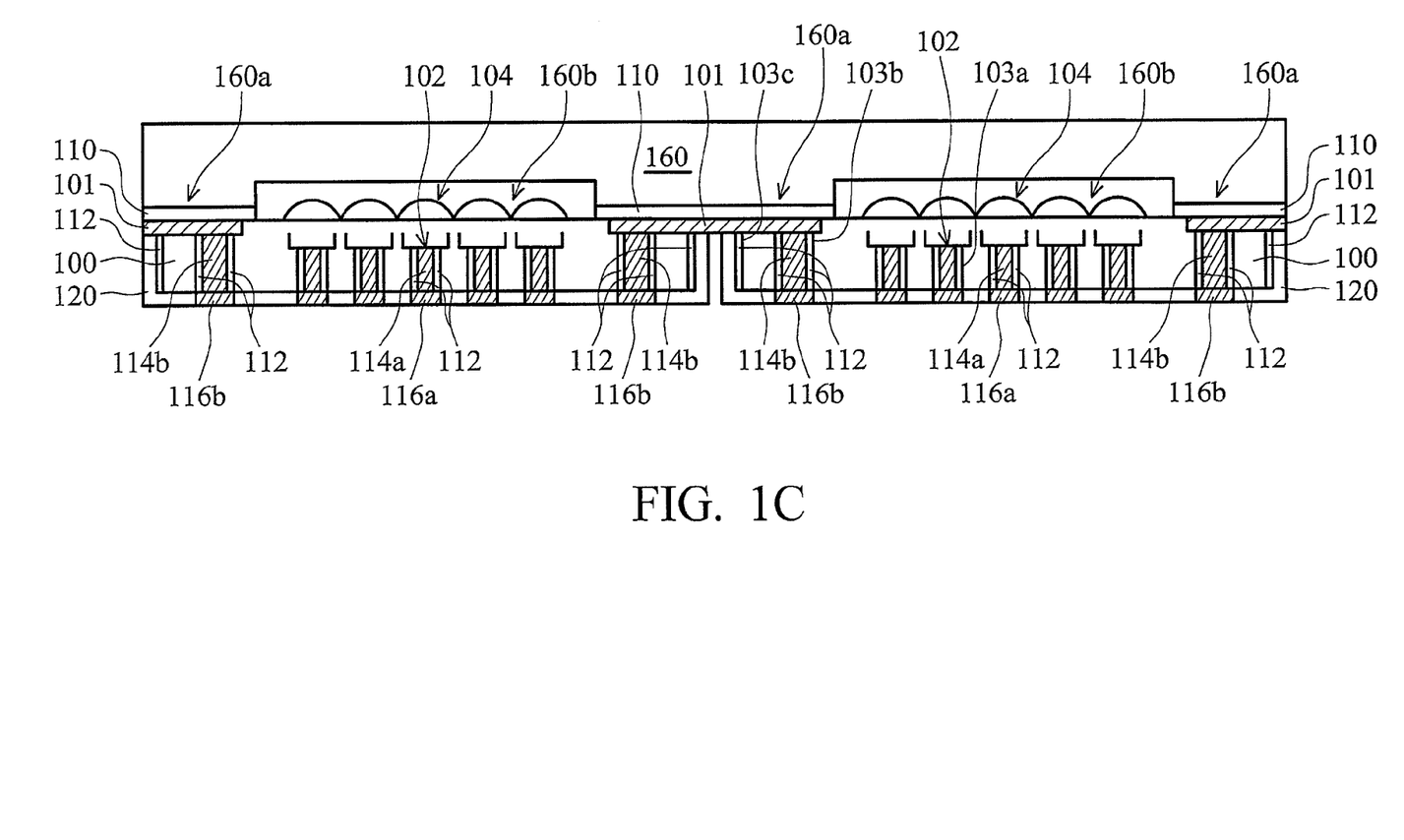
Figure 1D:
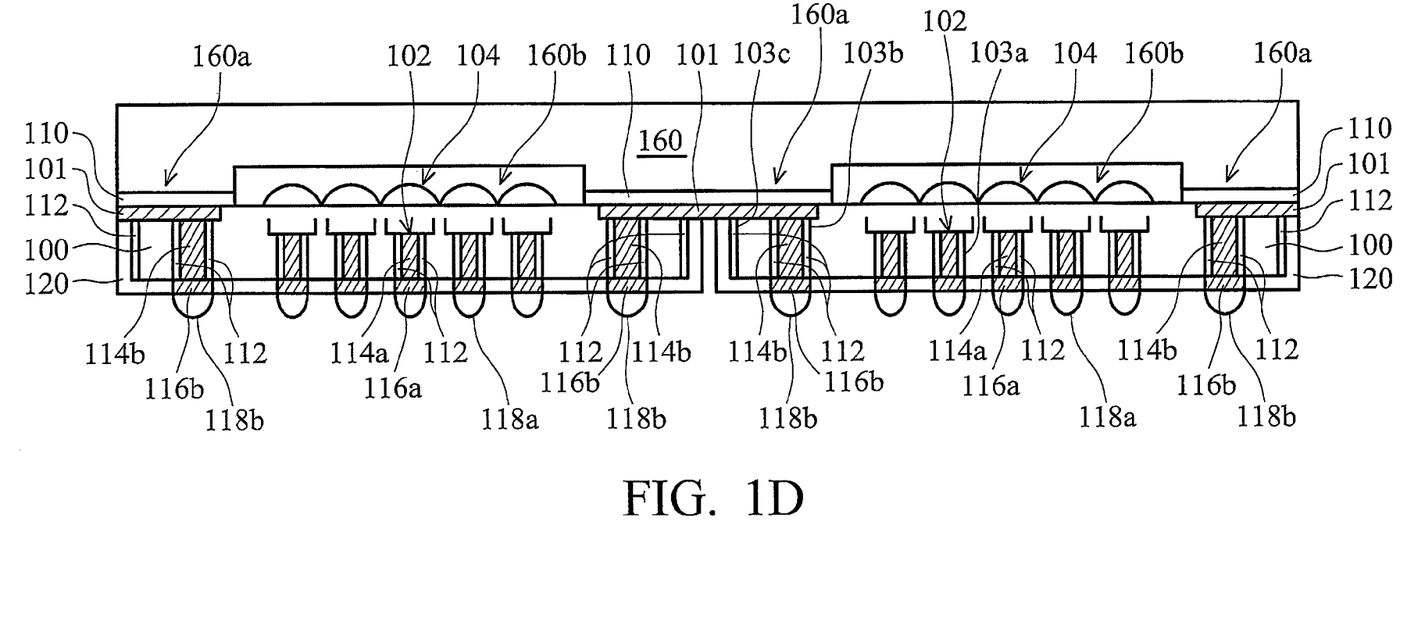
Figure 1E:
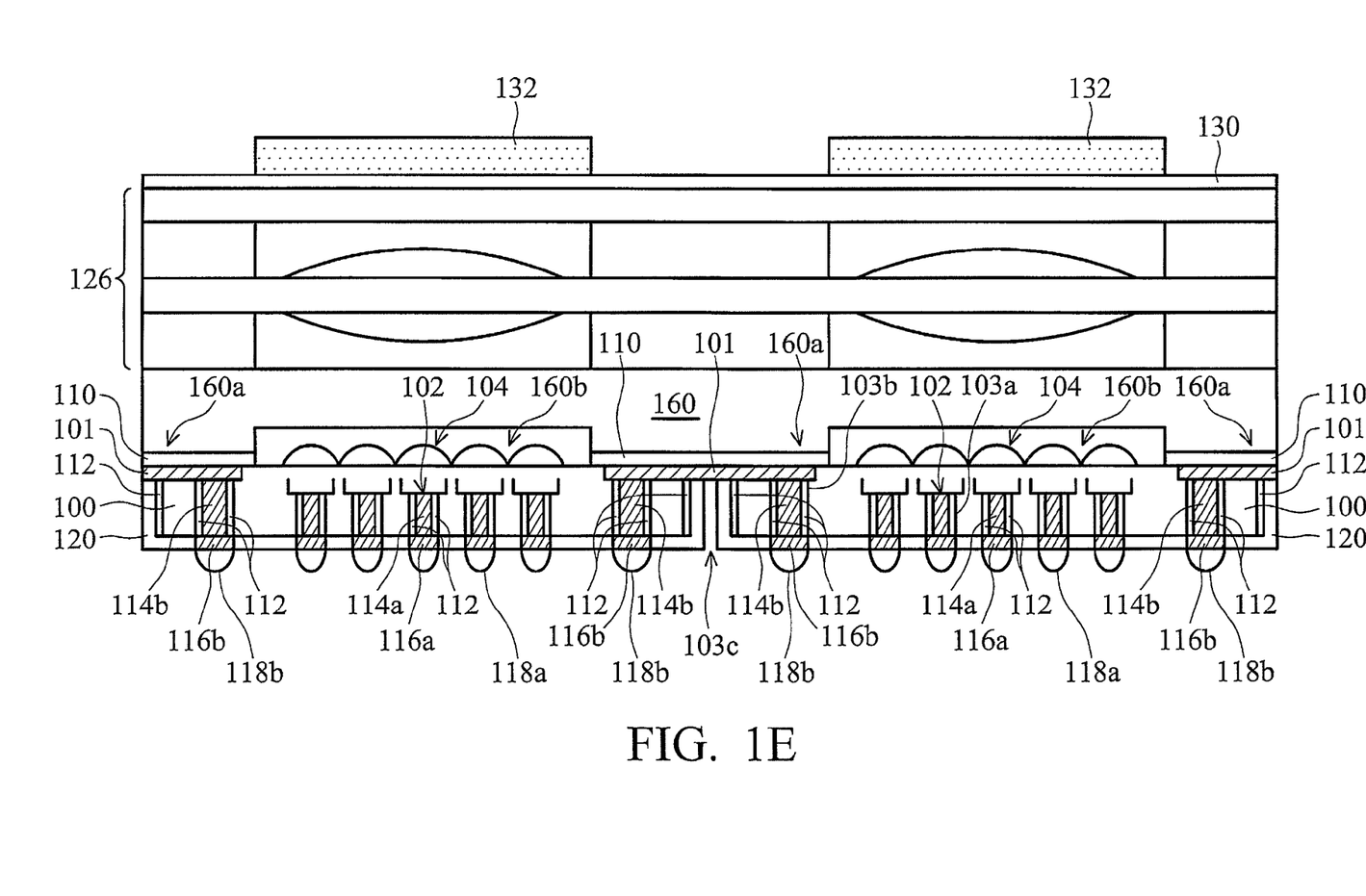
Figure 1F:
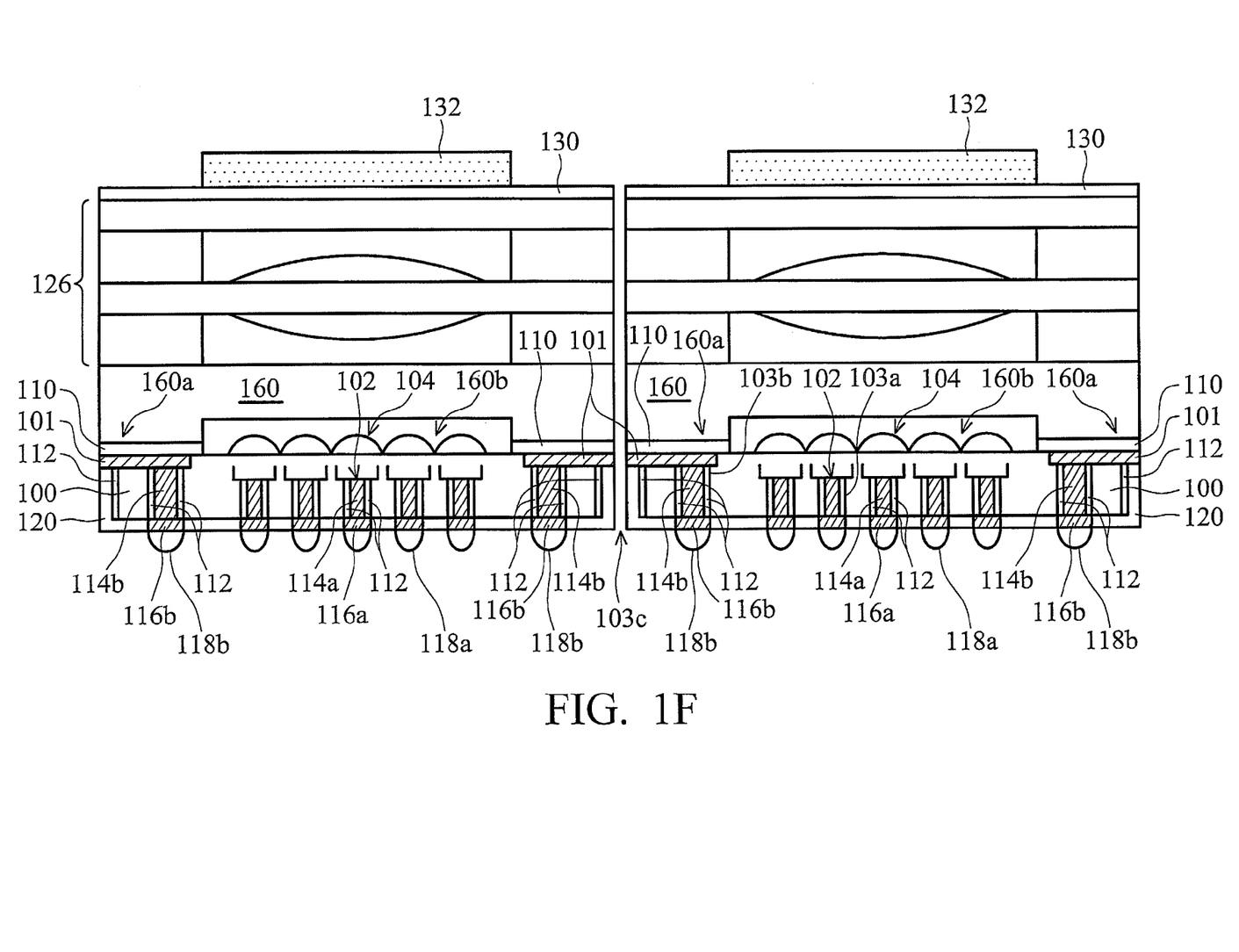
Figure 1G:
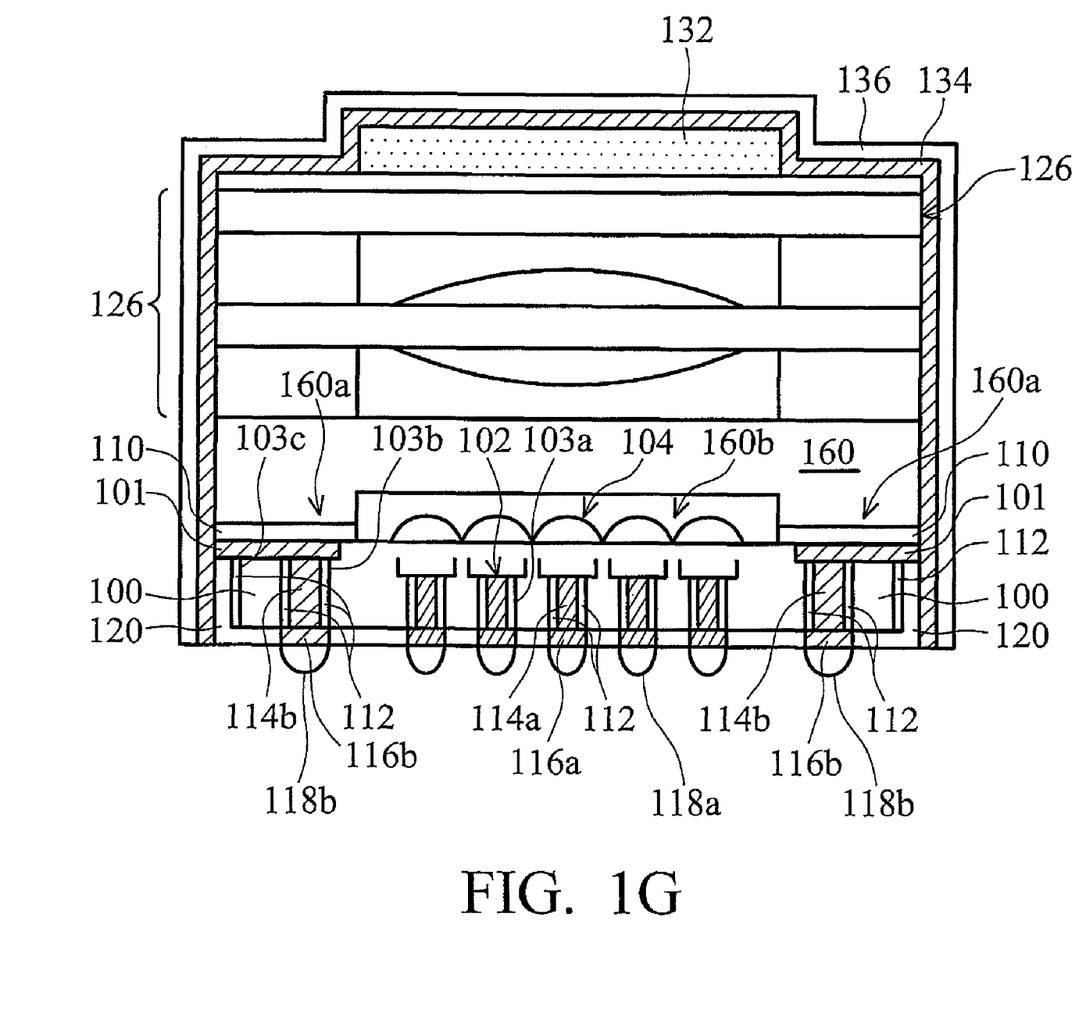
Figure 1H:
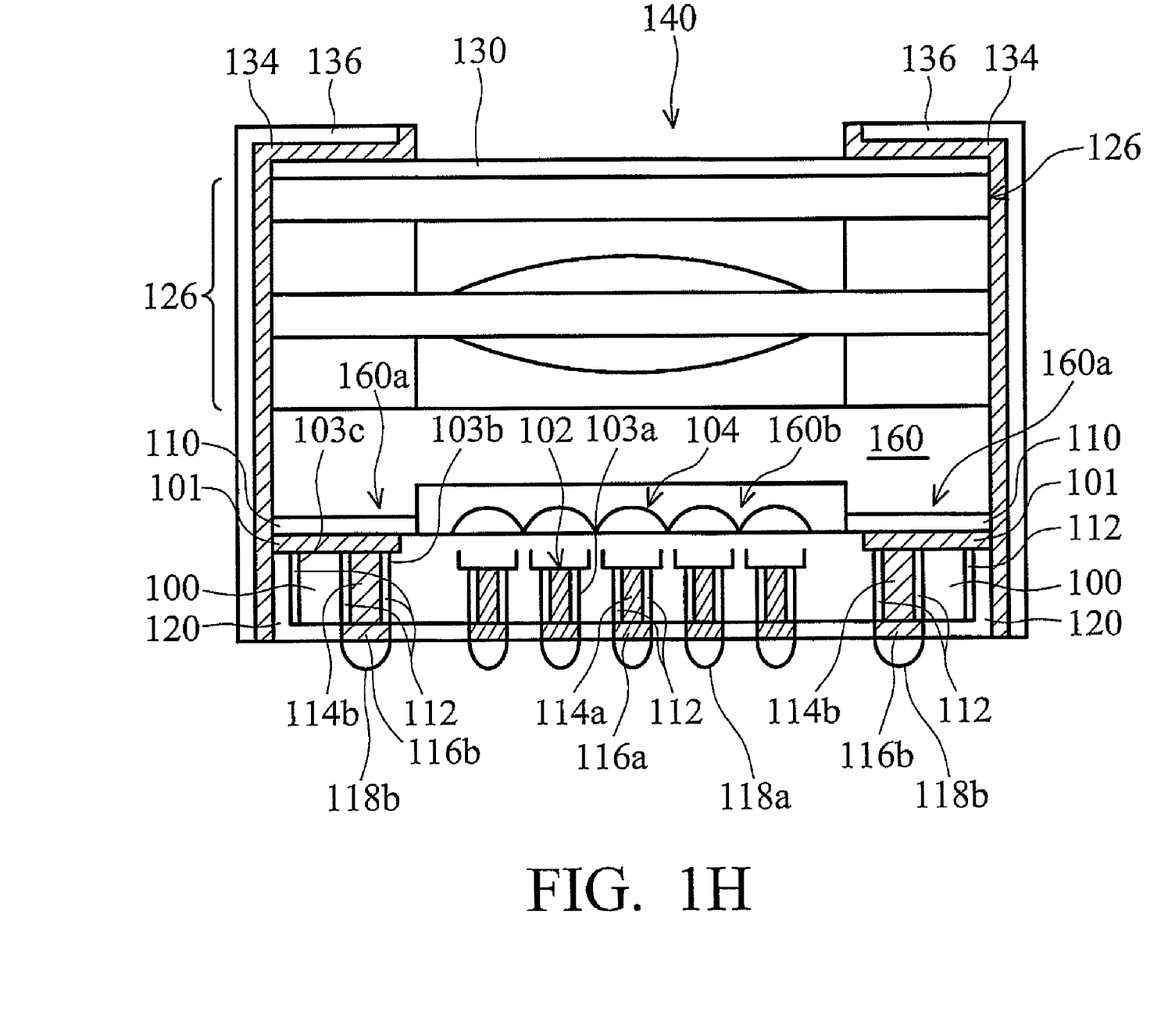

FIGS. 1A to 1H are cross sections of an exemplary embodiment of a method for fabricating an electronic assembly for an image sensor device according to wafer level CSP technology. As shown in FIG. 1A, a device wafer/substrate 100 comprising silicon or other semiconductor material is provided. The device wafer 100 comprises a plurality of arrays of optoelectronic devices 102, such as pixel diodes, formed therein. Each array of optoelectronic devices 102 is isolated from each other by a plurality of conductive layers 101, such as metal layers. Each conductive layer 101 is insulated from the device wafer 100 by a dielectric layer (not shown) and is not electrically connected to any array of optoelectronic devices 102. A transparent wafer/substrate 160, such as a glass or quartz substrate, comprising a plurality of dam portions 160a is attached to the device wafer 100 by an adhesion layer 110, thereby forming cavities 160b between the device wafer 100 and the transparent wafer 160. Prior to bonding the transparent wafer 160 on the device wafer 100, a plurality of micro-lens arrays 104 is formed on the device substrate 100 corresponding to cavity 160b, such that each micro-lens array 104 can be disposed within the corresponding cavity 160b after bonding the transparent wafer 160 on the device wafer 100.

Referring to FIG. 1B, the device wafer 100 is thinned down by polishing. Next, the device wafer 100 is etched to form via holes 103a, 103b, and 103c. The via hole 103a, arranged in a plurality of arrays, exposes the corresponding arrays of optoelectronic devices 102. The via holes 103b and 103c exposes the conductive layers 101. In particular, the via hole 103c serves as scribe lines of the device wafer 100.

Referring to FIG. 1C, a dielectric layer 112 is formed on the inner sidewall of each of the via holes 103a, 103b, and 103c. The via holes 103a and 103b are subsequently filled with a conductive material, such as metal, to form arrays of conductive plugs 114a electrically connected to the arrays of optoelectronic devices 102 and grounding plugs 114b electrically connected to the conductive layers 101. The arrays of conductive plugs 114a and grounding plugs 114b are insulated from the device wafer 100 by the dielectric layer 112. After formation of the arrays of conductive plugs 114a and grounding plugs 114b, the arrays of bonding pads 116a are formed on the corresponding arrays of conductive plugs 114a and the grounding pads 116b are formed on the corresponding grounding plugs 114b. Next, a protective layer 120, such as a solder mask, is formed on the lower surface of the device wafer 100 and on the sidewall of the via holes 103c, exposing the arrays of bonding pads 116a and the grounding pads 116b.

Referring to FIG. 1D, solder ball placement process is performed to form grounding balls 118b on the corresponding grounding pads 114b and ball grid arrays 118a are formed on the corresponding arrays of bonding pads 116a.

Referring to FIG. 1E, a lens set 126 is subsequently mounted on the transparent wafer 160. In this embodiment, the lens set 126 comprises a stack of multiple lenses and does not use a housing or holder for mounting the lens set onto the transparent wafer 160. A transparent conductive layer 130, such as an ITO or IZO layer, is optionally deposited on the upper surface of the lens set 126. Next, a masking pattern layer 132, such as a photoresist or resin layer is formed on the transparent conductive layer 130 corresponding to each micro-lens array 104.

Referring to FIG. 1F, a dicing process is performed along the via holes 103c serving as scribe lines of the device wafer 100 to form a plurality of CSP modules with a lens set 126 thereon. A portion of the conductive layer 101 in the device substrate 100 is thus exposed after the dicing process.

Referring to FIG. 1G, a conductive layer 134, such as a metal layer, is formed on the sidewall and upper surface of each CSP module with a lens set 126, as shown in FIG. 1F, to cover the transparent conductive layer 130 and the masking pattern layer 132. In order to simplify the diagram, only one CSP module with a lens set 126 is depicted. The conductive layer 134 on the sidewall of the device substrate 100 is in direct contact with the exposed conductive layer 101, thereby electrically connecting the grounding balls 118b through the grounding plugs 114b and the grounding pads 116b. An opaque layer 136 comprising, for example, of opaque paint, is formed on the conductive layer 134 to serve as a light shielding layer.

Referring to FIG. 1H, the masking pattern layer 132 and the opaque and conductive layers 136 and 134 thereon are removed from the transparent conductive layer 130, thereby forming an opening 140 in the left opaque and conductive layers 136 and 134 for allowing light (not shown) to reach the array of optoelectronic devices 102. Thus, completing the electronic assembly with EMI protection. Note that light shielding is provided by the left opaque layer 136 and EMI protection is provided by the left conductive layer 134 and the transparent conductive layer 130.

Figure 2:
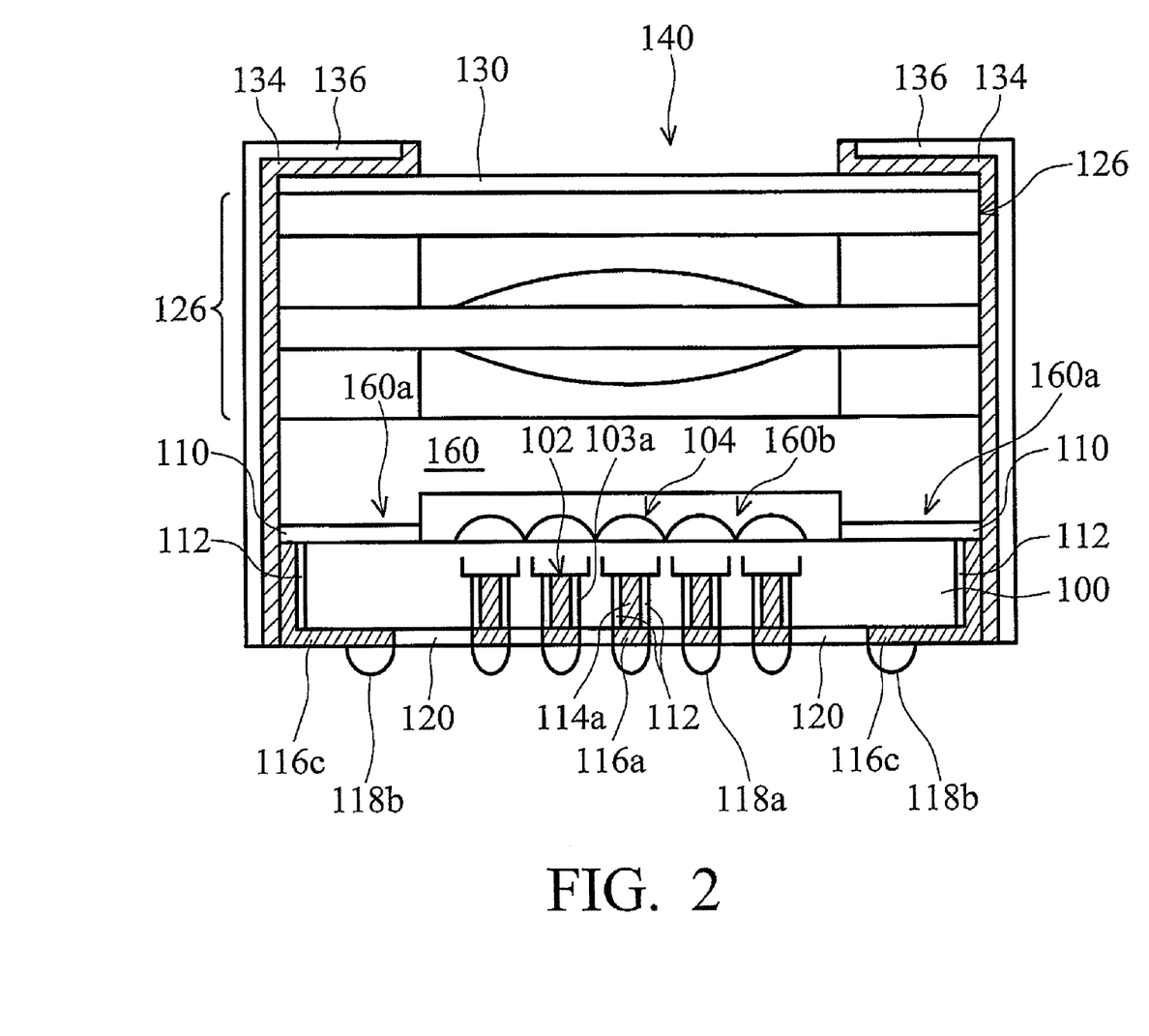
FIG. 2 is a cross section of another exemplary embodiment of an electronic assembly for an image sensor device according to the invention.

FIG. 2 illustrates another exemplary embodiment of an electronic assembly for an image sensor device according to the invention, in which elements in FIG. 2 that are the same as in FIGS. 1A to 1H are labeled the same and not described further again for brevity. Unlike the embodiment of FIG. 1H, the conductive layer 134 is electrically connected to at least one grounding ball 118b by directly contacting at least one grounding pad 116c. In this embodiment, the grounding pad 116c is disposed on a rear surface of the device substrate 100 and extends to the sidewall of device substrate 100 to contact the conductive layer 134. The rear surface of device substrate 100 has a surface opposite to a front surface of device substrate 100, wherein a micro-lens array 104 is formed thereon and a dam portion 160a of a transparent substrate 160 is attached thereon. Accordingly, the conductive layer 101 and the grounding plug 114b as shown in FIG. 1H, are no longer required according to this embodiment. Also, the grounding pad 116c is insulated from the device substrate 100 and the array of optoelectronic devices 102.

Figure 3:
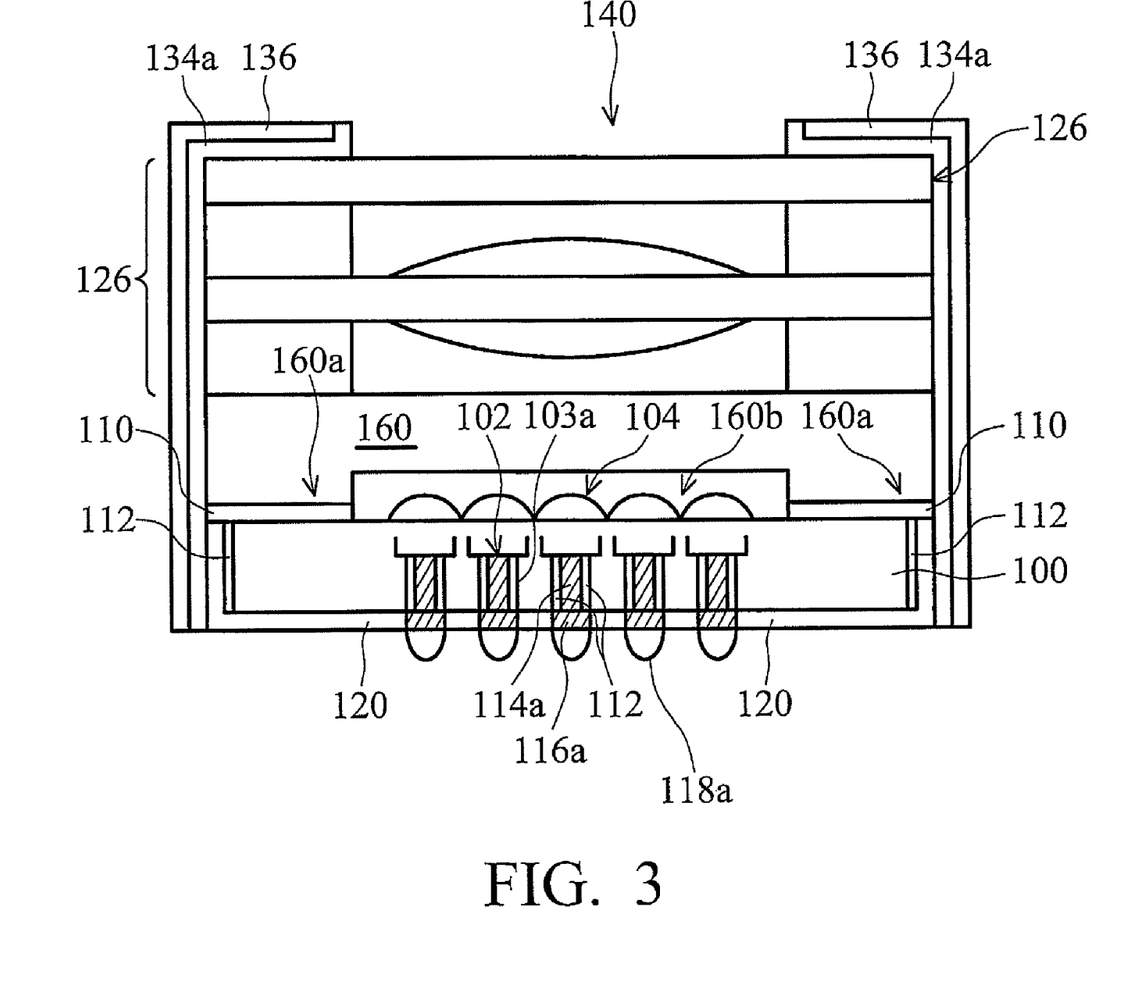
FIG. 3 is a cross section of yet another exemplary embodiment of an electronic assembly for an image sensor device according to the invention.

FIG. 3 illustrates yet another exemplary embodiment of an electronic assembly for an image sensor device according to the invention, in which elements in FIG. 3 that are the same as in FIGS. 1A to 1H are labeled the same and not described further again for brevity. In particular, in this embodiment, a permeability layer 134a is utilized instead of the conductive layer 134 and the transparent conductive layer 130, as shown in the embodiments of FIGS. 1H and 2 for EMI protection. Accordingly, the grounding plug 114b and the grounding pad 116b shown in FIG. 1H or the grounding pad 116c shown in FIG. 2 are no longer required according to this embodiment.

According to the aforementioned embodiments, the conductive layer 134 or a permeability layer 134a can be utilized for EMI protection. Compared to utilizing a metal housing for EMI protection, the size and weight of the electronic assembly can be reduced. Moreover, since the electronic assembly can be fabricated without forming an additional housing or cover for EMI protection, manufacturing cost can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic assembly for an image sensor device, comprising:
    a package module, comprising,
    a device substrate, comprising an array of optoelectronic devices therein,
    a transparent substrate, comprising a dam portion attached to the device substrate to form a cavity between the device and transparent substrates, and
    a micro-lens array disposed on the device substrate and within the cavity;
    a lens set mounted on the package module; and
    a permeability layer covering the sidewalls of the lens set and the package module and the upper surface of the lens set, having an opening allowing light to reach the array of optoelectronic devices.

2. The electronic assembly as claimed in claim 1, further comprising an opaque layer covering the permeability layer.

3. The electronic assembly as claimed in claim 1, wherein the device substrate further comprises:
    an array of plugs, disposed in and insulated from the device substrate and electrically connected to the array of optoelectronic devices; and
    a ball grid array, correspondingly disposed on the array of plugs.

4. An electronic assembly for an image sensor device, comprising:
    an image sensor chip scale package module;
    a lens set mounted on the image sensor chip scale package module;
    a permeability layer covering and in direct contact with the sidewalls of the lens set and the package module; and
    an opaque layer covering the permeability layer.

5. The electronic assembly as claimed in claim 4, wherein the opaque layer comprises opaque paint.

6. The electronic assembly as claimed in claim 4, wherein the image sensor chip scale package module comprises:
    a device substrate, comprising,
    an array of optoelectronic devices therein,
    an array of plugs, disposed in and insulated from the device substrate and electrically connected to the array of optoelectronic devices, and
    a ball grid array, correspondingly disposed on the array of plugs,
    a transparent substrate, comprising a dam portion attached to the device substrate to form a cavity between the device and transparent substrates, and
    a micro-lens array disposed on the device substrate and within the cavity.

7. The electronic assembly as claimed in claim 6, wherein the permeability layer covers the upper surface of the lens set and has an opening allowing light to reach the array of optoelectronic devices.

8. The electronic assembly as claimed in claim 7, wherein the permeability layer upwardly extends along the sidewall of the opening, such that at least portion of the permeability layer is exposed from a top surface of the opaque layer.

* * * * *